(12) United States Patent
Valle et al.

(10) Patent No.: US 11,183,981 B2
(45) Date of Patent: Nov. 23, 2021

(54) METHOD OF MONITORING ELECTRICAL LOADS, CORRESPONDING CIRCUIT, AMPLIFIER AND AUDIO SYSTEM

(71) Applicant: STMicroelectronics S.r.l., Agrate Brianza (IT)

(72) Inventors: Stefano Valle, Milan (IT); Flavio Polloni, Cuggiono (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/984,445

(22) Filed: Aug. 4, 2020

(65) Prior Publication Data

US 2021/0083637 A1 Mar. 18, 2021

(30) Foreign Application Priority Data

Aug. 28, 2019 (IT) .................. 102019000015144

(51) Int. Cl.
  *H03G 3/30* (2006.01)
  *H03F 3/183* (2006.01)
  *H04R 3/00* (2006.01)
  *H04R 29/00* (2006.01)

(52) U.S. Cl.
  CPC .......... *H03G 3/3005* (2013.01); *H03F 3/183* (2013.01); *H04R 3/00* (2013.01); *H04R 29/001* (2013.01); *H03F 2200/03* (2013.01); *H03G 2201/103* (2013.01); *H04R 2499/13* (2013.01)

(58) Field of Classification Search
  CPC ............ H03G 3/3005; H03G 2201/103; H03F 3/183; H03F 2200/03; H04R 3/00; H04R 29/001; H04R 2499/13
  USPC ............................................................ 381/59
  See application file for complete search history.

(56) References Cited

U.S. PATENT DOCUMENTS

| | | | | |
|---|---|---|---|---|
| 4,980,920 | A * | 12/1990 | Noro .................. | H03F 1/56 381/59 |
| 5,881,130 | A | 3/1999 | Zhang | |
| 8,538,032 | B2 * | 9/2013 | Woelfl .............. | H04R 3/00 381/59 |
| 2002/0149424 | A1 | 10/2002 | Honda | |
| 2009/0222227 | A1 | 9/2009 | Gonano et al. | |
| 2014/0126730 | A1 * | 5/2014 | Crawley ........... | H04R 29/001 381/59 |
| 2016/0161562 | A1 | 6/2016 | Stulrajter | |
| 2017/0015588 | A1 | 1/2017 | Melbouci et al. | |
| 2017/0150281 | A1 * | 5/2017 | Botti ................. | G01R 27/02 |
| 2017/0254844 | A1 | 9/2017 | Sestok, IV | |

(Continued)

FOREIGN PATENT DOCUMENTS

EP 2261682 A1 12/2010

*Primary Examiner* — David L Ton
(74) *Attorney, Agent, or Firm* — Slater Matsil, LLP

(57) ABSTRACT

A method of monitoring electrical loads is disclosed. In an embodiment the method includes generating a first voltage signal and a second voltage signal, the second voltage signal in quadrature to the first voltage signal, injecting one of the first voltage signal or the second voltage signal into a signal propagation path towards an electrical load, sensing a current signal flowing through the electrical load as a result of the one of the first voltage signal or the second voltage signal injected into the signal propagation path and processing the first voltage signal, the second voltage signal and the sensed current signal.

19 Claims, 4 Drawing Sheets

(56) References Cited

U.S. PATENT DOCUMENTS

2018/0358941 A1     12/2018  Lamesch
2020/0186927 A1*    6/2020   Lesso .................. H04R 29/001

* cited by examiner

METHOD OF MONITORING ELECTRICAL LOADS, CORRESPONDING CIRCUIT, AMPLIFIER AND AUDIO SYSTEM

CROSS-REFERENCE TO RELATED APPLICATIONS

This application claims the benefit of Italian Patent Application No. 10201900005144, filed on Aug. 28, 2019, which application is hereby incorporated herein by reference.

TECHNICAL FIELD

The description relates to monitoring electrical loads, for diagnostic purposes, for instance. One or more embodiments may be applied for monitoring loudspeakers. One or more embodiments may be applied in automotive audio systems, for built-in loudspeaker diagnostics, for instance.

BACKGROUND

Being able to monitor conditions of electrical loads—loudspeakers being an exemplary case—during their lifetime (for damages, disconnections, and so on) is a desirable feature in various applications such as audio systems. Adequate operation of such systems in cars, for instance, may benefit from the ability to perform fast and accurate checks.

To that effect, present-day audio amplifiers may already include built-in circuitry to monitor (and digitalize) the current flowing in the loudspeaker load. For instance, loudspeaker impedance conditions can be evaluated injecting a known (voltage) signal and monitoring a corresponding current flow.

SUMMARY

Embodiments provide improved solutions along the lines discussed in the foregoing.

One or more embodiments may relate to a corresponding circuit, adapted to be integrated in an audio amplifier, for instance.

One or more embodiments may relate to a corresponding amplifier, such as a class-D amplifier, for instance.

One or more embodiments may relate to a corresponding audio system. A car audio system may be exemplary of such a system.

One or more embodiments may offer one or more of the following advantages: accuracy and speed of operation, capability of detecting a wide range of anomalous conditions (open, short, soft-short, heating), flexibility (DC or AC connected speaker, woofer, tweeter), robustness against external events (door slam, car bouncing, for instance), silent operation (injecting audible signals or noise can be avoided), and no interference with the LC filter in the case of class-D amplifiers.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

As discussed, load measurement may represent an interesting feature in various applications such as audio systems (switching amplifiers, for instance, as exemplified in U.S. Publication No. 2014/023198 A1 or U.S. Publication No. 2018/0241354 A1).

Figure 1:
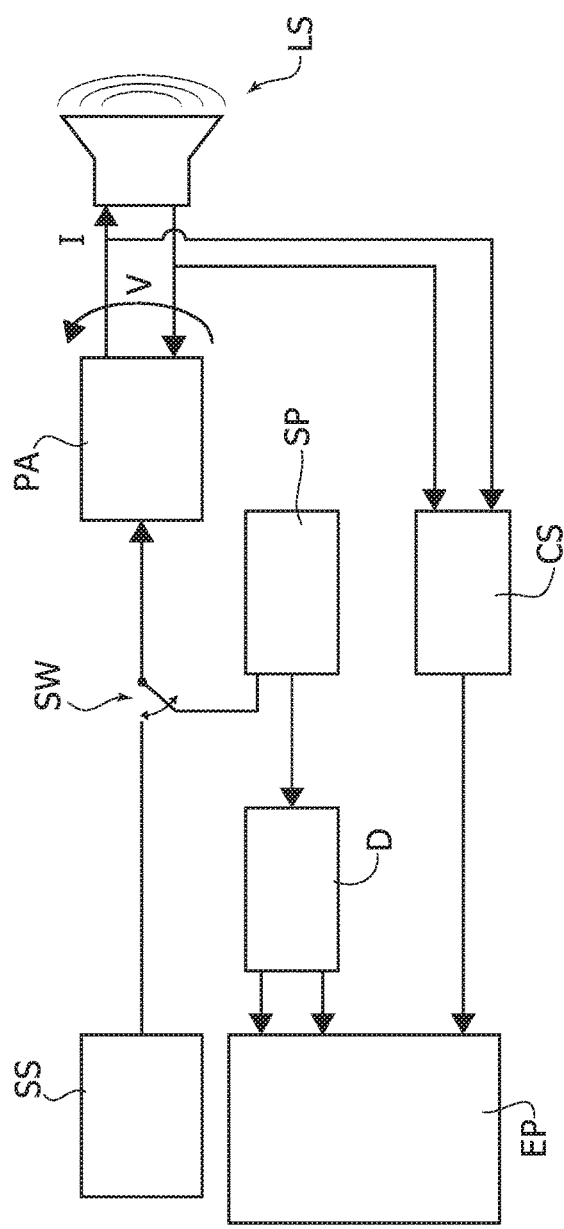
FIG. 1 is a block diagram exemplary of the general layout of an audio system including a speaker monitoring feature.

FIG. 1 is a block diagram exemplary of the general layout of an audio system comprising: an audio signal source SS (radio, CD, streamer, mobile device, and so on), an amplifier PA receiving an audio signal from the signal source SS and a loudspeaker LS supplied with the audio signal amplified by the amplifier PA.

It will be otherwise appreciated that the representation of FIG. 1 is of general nature, so that the designation "amplifier" PA may in fact apply to a signal amplifying chain including, for instance, pre-amplifier and power amplifier stages, an equalizer and other parts not visible in the figure.

Similarly, the designation "loudspeaker" PA may apply to a single loudspeaker as well to a system including plural units (woofer, tweeter, mid-range) to cover various portions of the audible frequency range.

FIG. 1 is exemplary of the—per se conventional—possibility of injecting into the audio signal propagation path from a source SS towards a loudspeaker LS (at a point SW, for instance) a "probing" (voltage) signal from a probing signal source SP with a (current) signal through the loudspeaker LS sensed at a current sensor CS.

These signals can then be processed in a processing block, indicated as IEP, which is configured to implement a procedure for determining the loudspeaker impedance Z=V/I.

A delay may be applied at a block D to the probe signal from SP to IEP in order to take into account the delay encountered by the signal propagated through the amplifier PA and the sensor CS.

Arrangements as exemplified in FIG. 1 may suffer from various drawbacks, primarily from limited flexibility related to various factors such as, for instance, measurements limited to DC-only or fixed-AC frequency conditions, reduced flexibility in amplitude control for silent operation, costly implementations.

Figure 2:
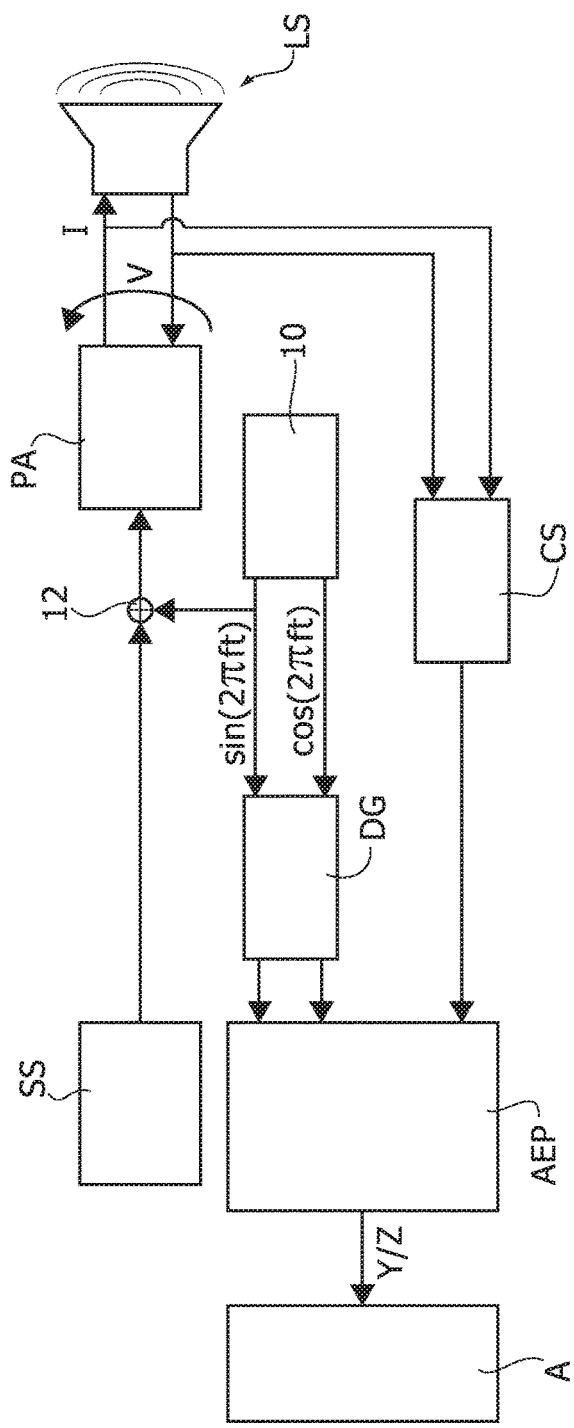
FIG. 2 is a block diagram exemplary of the possible layout of an audio system including a speaker monitoring feature according to embodiments as per the present description.

FIG. 2 is a block diagram exemplary of the possible layout of an audio system including a speaker monitoring feature.

As discussed in the following, a possible implementation of such a feature may involve sin/cos signals digitally generated and converted by a DAC into an analog signal suitable for amplification.

As in the case of FIG. 1, the audio system exemplified in FIG. 2 comprises an audio signal source SS, an amplifier PA receiving an audio signal from the signal source SS and a loudspeaker LS supplied with the audio signal amplified by the amplifier PA.

Here again it will be appreciated that: as further discussed in connection with FIG. 6, the designation "amplifier" PA in FIG. 2 may in fact apply to a signal amplifying chain including pre-amplifier and power amplifier stages, as well as other elements (an audio mute, a noise shaper circuit, an equalizer, and so on) not visible in the figure, and the designation "loudspeaker" PA may apply to a single loudspeaker as well to a system including plural units (woofer, tweeter, midrange) to cover various portions of the audible frequency range.

Also, one or more embodiments may comprise plural loudspeakers (in a stereo or multi-channel arrangement, for instance): a single audio signal propagation path towards a single loudspeaker LS is discussed herein and shown in the figures merely for the sake of simplicity.

As used herein, the designation signal propagation path will generally apply to any line arrangement (for instance, but not limited to, cabling, wire harness, printed circuit tracks and so on) capable of propagating an electrical signal towards a load as exemplified by a loudspeaker.

In the arrangement of FIG. 2, a (current) signal applied to the loudspeaker LS is again sensed at CS to be processed with the aim of estimating the loudspeaker impedance/admittance. Impedance and admittance are mutually related by being one the reciprocal of the other: the loudspeaker admittance (measured in Siemens) is the reciprocal of the impedance (measured in Ohms) and vice-versa.

In an arrangement as exemplified FIG. 2 a (test or probe) signal is injected into the path from the source SS to the loudspeaker LS (between the source SS and the amplifier PA, for instance).

To that effect, one or embodiments may include a tone source circuit block 10 configured to generate two (sinusoidal) signals at a frequency f which are in quadrature to each other (that is mutually phase-offset by 90°), namely $\sin(2\pi f t)$ and $\cos(2\pi f t)$.

A first one of these signals ($\sin(2\pi f t)$, for instance) is injected at 12 into the audio signal propagation path from the source SS to the loudspeaker LS (between the source SS and the amplifier PA, for instance) and also forwarded, together with the quadrature signal ($\cos(2\pi f t)$, for instance), to a processing block designated AEP.

The processing block AEP can be configured to implement an estimation procedure of the loudspeaker admittance Y (the reciprocal of the loudspeaker impedance Z=V/I) as discussed in the following.

In an arrangement as exemplified in FIG. 2 a delay and a gain (an automatic amplitude adjustment on load basis, for instance) may be applied at a block DG to both signals $\sin(2\pi f t)$ and $\cos(2\pi f t)$ forwarded to the processing block AEP in order to take into account the delay encountered by the signal propagated through the amplifier PA and the sensor CS as well as the gain applied to the audio signal in the amplifier PA.

Figure 3:
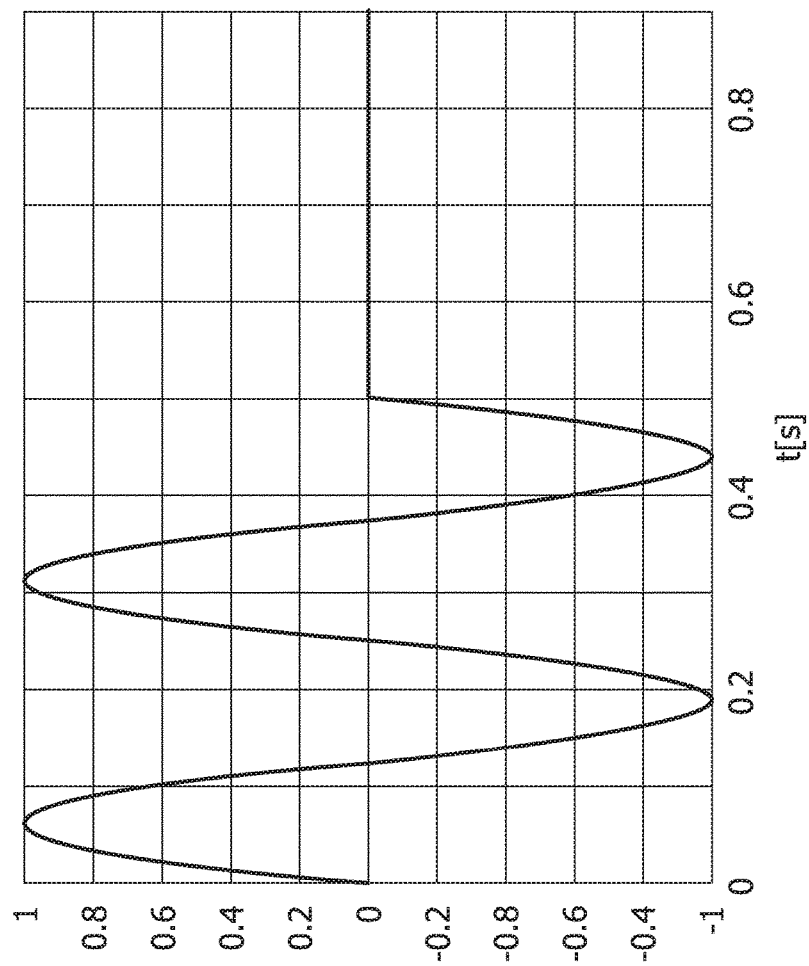
FIG. 3 is a diagram exemplary of the possible time behavior of a probe signal for use in embodiments as per the present description.

The diagram of FIG. 3 is an exemplary representation of a possible time behavior of the signal $\sin(2\pi f t)$ (with $\cos(2\pi f t)$ having a similar time behavior offset by 90°).

An exemplary duration of about 0.5 s is shown in the abscissa scale of FIG. 3 with a normalized amplitude (which can be adjusted as desired).

The diagram of FIG. 3 is exemplary of the possibility, offered by one or more embodiments, of providing "built in" tone generation of $\sin(2\pi f t)$ and $\cos(2\pi f t)$ over a notionally unlimited set of frequencies (for instance, 128 frequencies covering the range [1-24 KHz], with a wide band impedance meter possibility, which facilitates bridging the gulf between DC or AC diagnostics.

A so-called COordinate Rotation DIgital Computer feature, briefly CORDIC, can be used advantageously for that purpose.

One or more embodiments may provide a programmable amplitude for $\sin(2\pi f t)$ and $\cos(2\pi f t)$ (as noted, FIG. 3 is a representation with a normalized amplitude, which can be adjusted as desired) over a range as wide as [−63:1:0 dbFs], for instance: this facilitates controlling "pop sound" generation and silent operation.

As discussed in the following, one or more embodiments facilitate determining the real/imaginary parts (magnitude/phase) of the loudspeaker impedance/admittance.

Duration of testing can be selected (made programmable, for instance) with the aim of pursuing a judicious trade-off of speed v. accuracy (looms min near DC; 5-10 ms min for AC, for instance).

Figure 4:
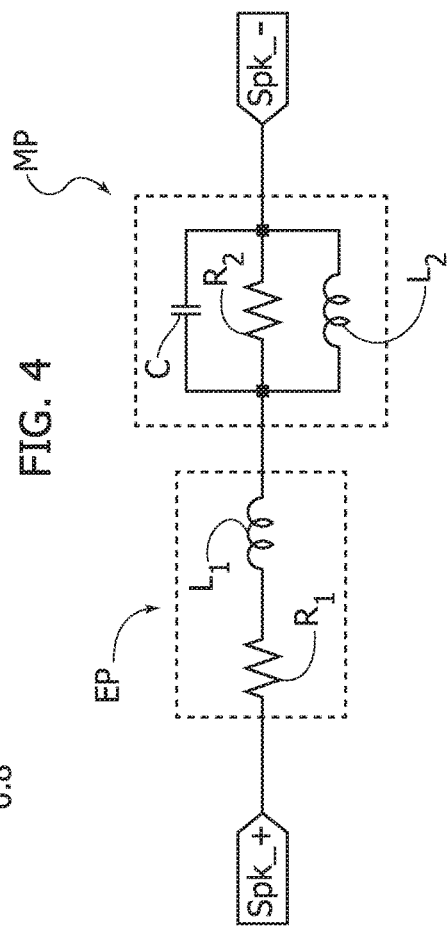
FIG. 4 is exemplary of an electrical model representative of a loudspeaker.

FIG. 4 is an exemplary model of a loudspeaker considered between two terminals Spk_+ and Spk_− (to be coupled the output from the amplifier PA).

A loudspeaker is a non-linear electromechanical system which can be modeled as the series connection of: an electrical part EP including the series connection of a first resistor $R_1$ and a first inductor $L_1$, and a mechanical part MP including the parallel connection of a capacitor C, a second resistor $R_2$ and a second inductor $L_2$.

The impedance between Spk_+ and Spk_− can thus be expressed as $$Z(s) = R_1 + sL_1 + \frac{1}{\frac{1}{R_2} + sC + \frac{1}{sL_2}}$$

This is a linear, simplified model which can effectively mimic an expected loudspeaker behavior neglecting non-linear effects due to large signals.

It will be otherwise appreciated that one or more embodiments are not related to any specific loudspeaker model such as the one exemplified in FIG. 4.

In a context as exemplified in FIG. 2, evaluating (AC/DC) loudspeaker impedance (admittance) response can be considered as a problem of estimation of amplitude and phase of sinusoidal signal with known frequency ($f_{in}$) representing the current flowing in a load when a voltage $v_{in}$ is applied $$v_{in} = \sin(2\pi f_{in} t)$$

$$i = Y \cdot \sin(2\pi f_{in} t + \varphi)$$

where Y and φ are the magnitude and phase, respectively, of the load admittance.

The problem can be re-formulated as the problem of finding simple quantities a and b related (equal, for instance) to the real and imaginary part of the admittance, that is:

$$i = Y \cdot \sin(2\pi f_{in} t + \varphi) = a \cdot \sin(2\pi f_{in} t) + b \cdot \cos(2\pi f_{in} t)$$

where Y and φ (the magnitude and phase, respectively, of the load—here, loudspeaker—admittance) can be expressed as:

$$Y = \sqrt{a^2 + b^2}$$

$$\varphi = \operatorname{atan}(a/b)$$

One may thus execute an approximation procedure of a current signal $i_k$ sensed (at CS, for instance) via a linear combination of $\sin(2\pi ft)$ and $\cos(2\pi ft)$ as expressed via a and b until a target approximation value is reached.

As well known to those of skill in the art this may involve updating the values for a and b until a target approximation is reached where a corresponding "cost" function is minimized.

A variety of approximation procedures known to those of skill in the art can be applied for that purpose based on different possible definitions of the distance/error/offset between the entity approximated (here $i_k$) and the approximating entity (here the linear combination of $\sin(2\pi ft)$ and $\cos(2\pi ft)$ as expressed via a and b which are being updated).

A Least-Mean-Square (LMS) procedure having a cost function defined as $$\min_{a,b} (E[(err_k)^2])$$

was found to represent an adequate possible choice for the purposes herein.

Such a procedure can be based on the relationships $$err_k = i_k - a \cdot \sin(2\pi f_{in} kT) - b \cdot \cos(2\pi f_{in} kT)$$

$$\frac{\partial}{\partial a}(err_k)^2 = -2 \cdot (err_k) \cdot \sin(2\pi f_{in} kT)$$

$$\frac{\partial}{\partial b}(err_k)^2 = -2 \cdot (err_k) \cdot \cos(2\pi f_{in} kT).$$

These factors indicate the direction of the gradient, that is the direction leading to minimizing the squared error, wherein $$a'' = a' + \gamma \cdot (err_k) \cdot \sin(2\pi f_{in} kT)$$

$$b'' = b' + \gamma \cdot (err_k) \cdot \cos(2\pi f_{in} kT)$$

represent an updating rule for each coefficient at the next sample time.

That updating rule may be simplified (for both factors a and b) by replacing the $err_k$ signal and the $\sin(2\pi f_{in} kT)$ and $\cos(2\pi f_{in} kT)$ with their signs.

In that way, for instance, the updating rule for the factor a can be simplified in the form, $$a'' \cong a' + \gamma \cdot \operatorname{sign}(err_k) \cdot \operatorname{sign}(\sin(2\pi f_{in} kT)).$$

In either case γ denotes the LMS gamma factor, which determines the speed of convergence of the procedure. The gamma factor can be selected as a one-off system adjustment parameter trading speed v. accuracy of measurements, for instance, while avoiding too high a value, which may result in instability.

Figure 5:
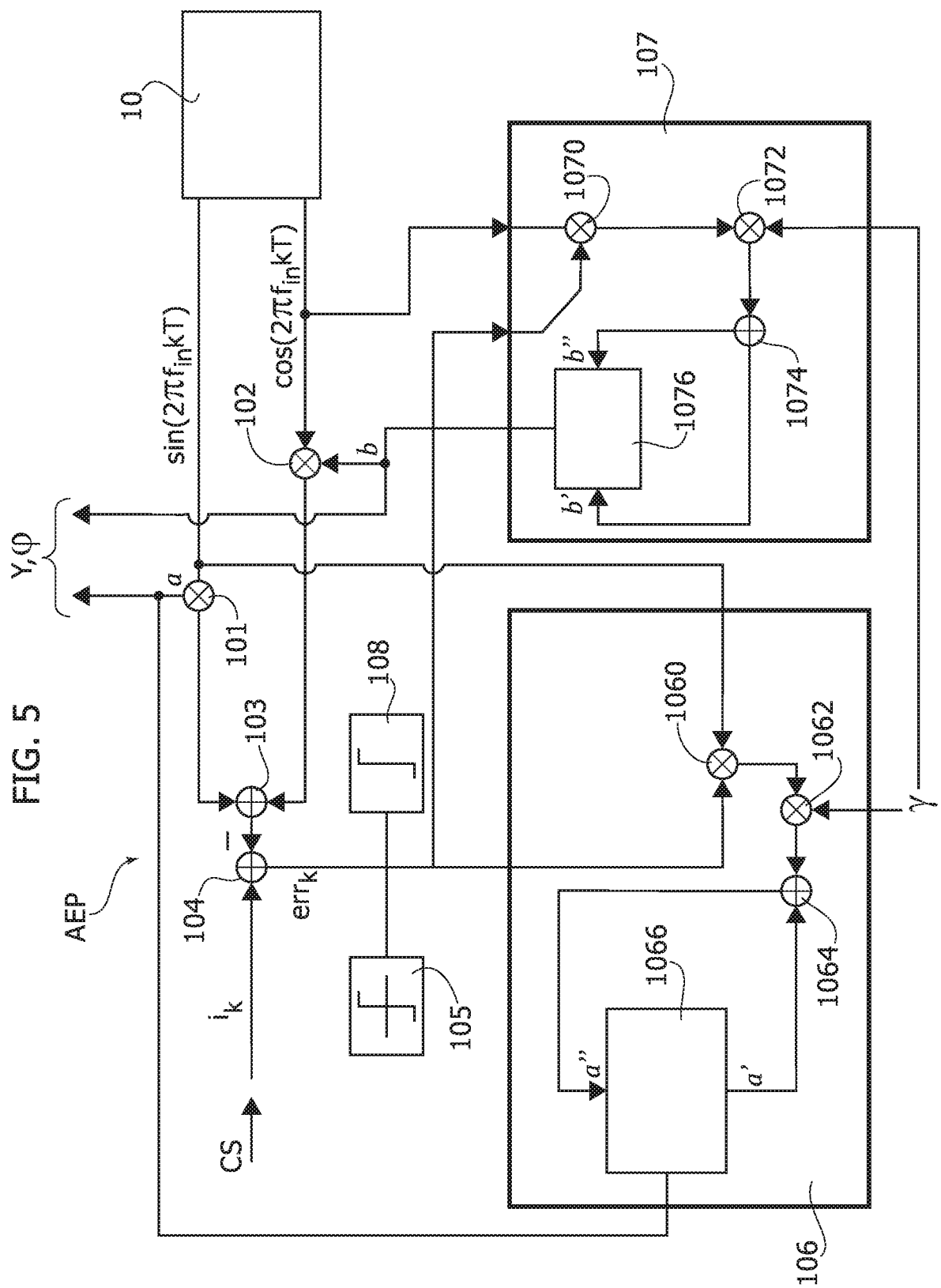
FIG. 5 is a block diagram exemplary of a possible implementation of embodiments as per the present description.

FIG. 5 is a block diagram of a possible implementation of such a procedure in a circuit as indicated by AEP in FIG. 2.

In FIG. 5, 10 denotes the tone source circuit block 10 (CORDIC, for instance) configured to generate the quadrature sinusoidal signals at a frequency $f_{in}$ mutually phase-offset by 90° (sin/cos), namely $\sin(2\pi f_{in} kT)$ and $\cos(2\pi f_{in} kT)$, where kT is indicative of these signals to be digital signals, time-sampled at a sampling frequency 1/T.

The signals $\sin(2\pi f_{in} kT)$ and $\cos(2\pi f_{in} kT)$ are applied to respective multiplier nodes 101 and 102 where they are multiplied by the factors a and b.

The signals thus multiplied are added at a summation node 103 to produce a (linear combination) signal representing a current estimation which at a further summation node 104 is added to (with negative sign, that is subtracted from) the signal $i_k$ indicative of the current sensed at CS in order to generate an error signal $err_k$.

In an embodiment as exemplified in FIG. 5, such an error signal can be monitored with a threshold circuit 105 configured to detect (and discard) unexpected current excursion due to door slam or car bouncing (or any unexpected behavior of a loudspeaker on unstable supports).

In an embodiment as exemplified in FIG. 5, two blocks 106 and 107 are shown which are configured to generate (updated) linear combination multiplication factors a and b to be applied at the multiplier nodes 101 and 102 as discussed previously.

As exemplified in FIG. 5, the blocks 106 and 107 may comprise:
a first multiplier 1060, 1070 which produces the product of $err_k$ and $\sin(2\pi f_{in} kT)$ and the product of $err_k$ and $\cos(2\pi f_{in} kT)$, respectively (or simply the signs thereof, in the case the simplified updating rule discussed in the foregoing is applied),
a second multiplier 1062, 1072 which multiplies by γ the product obtained at 1060, 1070, and
an adder node 1064, 1074 which, in conjunction with an accumulator 1066, 1076, implements the updating formulas involving a' and a" plus b' and b" as discussed previously.

As discussed, the delay/gain encountered by the signal propagated through the amplifier PA and the sensor CS can be compensated by the block DG in FIG. 2 or, in the case of the gain, by correspondingly scaling the linear combination factors (amplitudes), namely a and b or by properly scaling the current $i_k$ measured by the current sensor.

In the description of FIG. 5, the delay and gain encountered by the signal propagated through the amplifier PA and the sensor CS has been neglected for simplicity: that is, a unitary gain has been assumed, which may correspond to a gain correction in the return path, with delay properly compensated.

Reference 108 in FIG. 5 denotes an exemplary threshold circuit configured to sense a condition where the error $err_k$ reaches a (lower) threshold indicative that a desired, possibly adjustable, degree of accuracy has been reached in evaluating the admittance Y.

In one or more embodiments, one may judiciously assume that after a certain time (which may be a function of the gamma factor) the estimation procedure reaches a steady state around a certain target value, so that the estimation procedure can be held to be completed after a certain (possibly adjustable/programmable) time. This has the advantage of having a defined duration for the estimation procedure.

As a result of the estimation procedure completed (however this may be determined), final updated values for a and b will be available for calculating—as discussed in the foregoing—the magnitude and phase Y and φ of the loudspeaker admittance (or impedance, as possibly calculated as the reciprocal of the admittance in the processing circuit AEP) adapted to be supplied to an "action" circuit A (exemplified on the left hand side of FIG. 2).

This may be any type of circuit suited to take an action as a result of detecting a load (loudspeaker) admittance/impedance which may be held to correspond to an anomalous, undesired condition.

Based on the function intended, the circuit A can be configured to take one or more of a variety of actions depending on the nature and seriousness of the anomaly detected: these actions may range, for instance, from issuing an alert signal to a user entity to de-activating a system likely to be damaged as a result of continued operation (loudspeaker shorted or overheated, for instance).

For simplicity, the previous discussion of a procedure for evaluating a loudspeaker admittance/impedance has been provided in connection with a single frequency $f_{in}$.

In one or more embodiments, such a procedure can be repeated for a plurality of frequencies (the exemplary case has been considered previously of 128 frequencies covering the range [1-24 KHz]). Using a fairly large number of frequencies can be facilitated by using a CORDIC feature, as discussed previously, for generating the signals sin $(2\pi f_{in}kT)$ and cos$(2\pi f_{in}kT)$.

Using plural frequencies may facilitate taking into account that fact that the impedance/admittance curve of a loudspeaker may exhibit a fairly uneven behavior as a function of frequency.

A judicious choice of the number of frequencies may take into account factors such as the desired accuracy and refinement of the evaluation of loudspeaker admittance/impedance (which may involve a relatively large number of frequencies in case an accurate and detailed evaluation is desired) and the time and processing resources involved (with possibly even just one frequency involved if a fast evaluation is desired to identify possible short-circuits, for instance).

Also, one or more embodiments may contemplate (with possible additional HW) adapting the estimation procedure for a simultaneous estimation of admittance response at different frequencies by injecting a superimposed set of sinusoidal signal at different frequencies.

Figure 6:
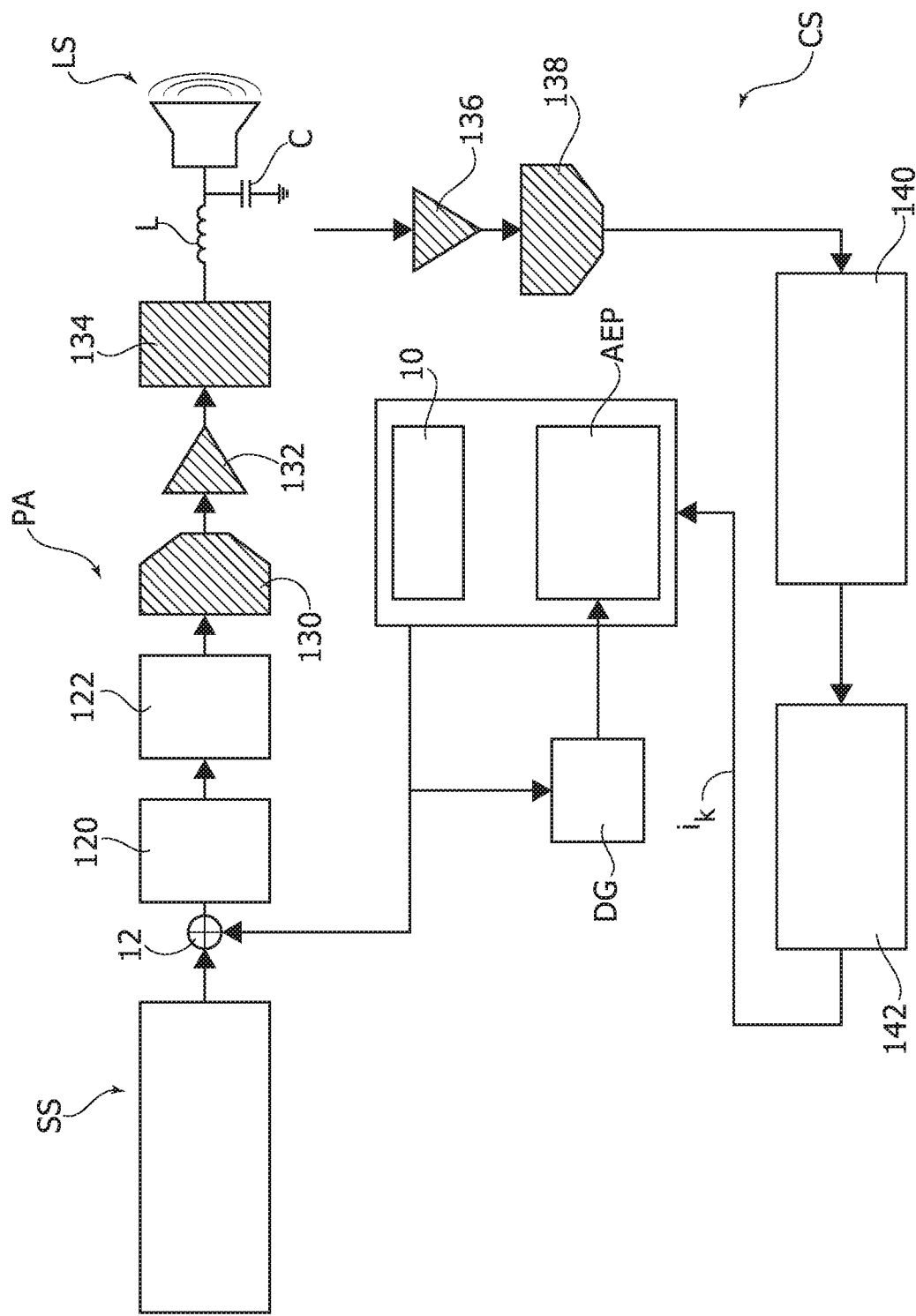
FIG. 6 is block diagram of an audio system including embodiments as per the present description.

FIG. 6 is block diagram of an audio system (for installation in a motor vehicle, for instance) including embodiments as per the present description.

In that respect, it will be again stressed that, while primarily conceived with the aim of monitoring loudspeakers, one or more embodiments may be applied to any context where evaluating the impedance/admittance of an electrical load may be desirable (for diagnostic purposes, for instance).

In FIG. 6 parts or elements like parts or elements already discussed in connections with the previous figures are indicated with like reference symbols, and a corresponding description will not be repeated here for brevity.

FIG. 6 exemplifies a possible use in connection with a class-D amplifier with digital input and on-board DAC which, in manner known per se, is configured to drive a loudspeaker LS via al LC low-pass network.

In that respect, it will be appreciated that such a possible implementation is not mandatory: one or more embodiments may contemplate an "external" implementation, via I2SRX, I2STX digital interfaces, for instance for the audio input signal and the output sensing current.

FIG. 6 exemplifies the possibility for the "amplifier" PA to include a digital front end comprising, for instance, an audio mute block 120 and a noise shaper circuit 122, followed by a digital-to-analog converter (DAC) 130. As exemplified herein, the DAC 130 produces a analog signal to be supplied to an analog power section which may comprise a filter 132 and a driver 134 coupled to the loudspeaker LS via a LC lowpass filter (as conventional in Class-D amplifiers).

FIG. 6 exemplifies a (current) sensing section CS coupled to the loudspeaker LS and comprising a preamplifier 136 followed by an analog-to-digital converter (ADC) 138 (sigma-delta, for instance).

As exemplified herein, the ADC 138 produces a digital signal supplied, for instance via a filter 140 (for improving SNR or, in case of a sigma-delta conversion, for decimating the ADC output down to a sampling rate compatible with the rate of the approximation procedure) to an offset detector and cancellation block 142 to provide the current signal $i_k$ to the AEP circuitry for processing as discussed previously.

In one or more embodiments (for instance, when a sigma-delta conversion is adopted), the filter 140 may include a combination of a cascaded integrator comb (CIC) compensating interpolator block and a finite impulse response (FIR) filter.

The "convergence" threshold 108 and the "action" circuit A are not visible in FIG. 6 for simplicity.

As exemplified herein, of the digital signals generated at 10, the sin component is injected into the digital signal path and thus converted into an analog signal and both components (sin and cos components) are applied to the delay line DG in order to take into account the delay affecting the current $i_k$ as a result of propagation through the analog and digital paths.

One or more embodiments facilitate monitoring the impedance of a load (a loudspeaker, for instance) in operation, with the possibility of running the procedure during normal operation of the amplifier. A test signal (for instance, a subsonic tone for near-DC admittance evaluation in audio systems) can be injected in superposition to the useful signal (the audio signal, for instance) which can be left running without corruption: a very low amplitude signal (~40 dBFs) can be used for that purpose in such a way that the test signal will not interfere with the functionality of the system. The procedure exemplified herein can detect impedance value and track changes thereof at run time. This approach avoids a preliminary phase of DC/AC diagnostic before audio signal is reproduced (before play). For example, a load check may be performed within the first seconds of operation, which facilitates fast startup (with useful audio sound, for instance).

In one or more embodiments: open load in-play detection is facilitated regardless of the input signal (for both DC and AC coupled speakers, for instance), monitoring of load DC resistance is facilitated for checking excessive heating, increased flexibility can be achieved with notionally contrasting factors such as speed/accuracy/silent operation suited to be traded by acting on various parameters such as the LMS gamma factor, amplitude and duration of the sinusoidal test signals; a whole loudspeaker bandwidth can be checked without external intervention (e.g., during service); loudspeaker operation can be monitored during normal play conditions and not during mute exclusively; adequate calibration of the delay line DG facilitates reducing (and virtually dispensing with) the effects of phase error on estimation; the real and imaginary part of admittance can be measured reliably, by distinguishing the load from the LC filter (class-D amplifiers).

While other conventional options can be considered in various embodiments, a LMS procedure provides a powerful tool suited to operate adequately in critical conditions (poor SNR, for instance) with the capability of rejecting the effects of external events such as door slam and car bouncing.

Briefly, one or embodiments may facilitate: identification of loudspeaker admittance (and thus impedance) over the whole audible band with a single type of procedure; a judicious accuracy v. speed trade-off; reliable detection of a wide range of anomalous conditions (open, short, soft-short, heating) are granted; flexibility in terms of condition detectable (DC or AC connected speaker, woofer, tweeter); robustness to external events (door slam, car bouncing), with the possibility of singling out and rejecting anomalous current excursions generated by such events and likely to adversely affect a LMS procedure; silent operation (amplitude control facilitates injecting non-audible signals for test purposes).

Once again, while extensive reference has been made throughout to audio applications where the load monitored comprises a loudspeaker, the embodiments—and a good deal of the advantages related thereto—are not limited to monitoring loudspeakers.

By way of example, various types of drive systems for electrical loads (electrical motors, being exemplary of these) may benefit from the use of embodiments.

A method as exemplified herein may comprise:

generating (for instance, via a CORDIC feature, 10) a first voltage signal (for instance, $\sin(2\pi f_{in}kT)$) and a second voltage signal (for instance, $\cos(2\pi f_{in}kT)$), the second voltage signal in quadrature (that is, with a 90° phase offset such as for sine and cosine signals at a same frequency $f_{in}$) to the first voltage signal, injecting (for instance, 12) one (for instance, $\sin(2\pi f_{in}kT)$) of the first voltage signal or the second voltage signal into a signal propagation path (for instance, PA) towards an electrical load (for instance, a loudspeaker LS), sensing (for instance, CS) a current signal (for instance, $i_k$) flowing through the electrical load as a result of said one of the first voltage signal or the second voltage signal injected into the signal propagation path towards the electrical load, processing (for instance, AEP) said first voltage signal, said second voltage signal and said current signal sensed, wherein said processing comprises:

calculating a linear combination of said first voltage signal and said second voltage signal via a first (for instance, a) and a second (for instance, b) linear combination coefficient, executing an approximation procedure of said current signal sensed via said linear combination, the approximation procedure comprising updating (for instance, a', a"; b, b", with the " value representing a generic update at a subsequent instant with respect the ' value) said first and second linear combination coefficients until a target approximation is reached (for instance, as a result of reaching a given threshold 108 or after a certain, possibly adjustable, time threshold indicative of the approximation procedure having reached a steady state), wherein the updated values of said first and second linear combination coefficients at said target approximation reached (for instance, the updated values which cause the approximation procedure to reach a certain target approximation) are indicative of an admittance of said electrical load, and calculating said admittance of the electrical load as a function the updated values of said first and second linear combination coefficients at said target approximation reached.

A method as exemplified herein may comprise calculating the real and imaginary parts of said admittance. For instance this may involve calculating the modulus (Y) and the phase ($\varphi$) of the electrical load as a function of the sum of the squares and of the ratio of the updated values of said first and second linear combination coefficients at said target approximation reached, for instance as:

$$Y=\sqrt{a^2+b^2}$$

$$\varphi=\mathrm{atan}(a/b).$$

In a method as exemplified herein said approximation procedure may comprise a least-mean-square (LMS) procedure targeting the reduction of squared error (for instance $$\min_{a,b}(E[(err_k)^2]))$$

between said current signal sensed and said linear combination.

A method as exemplified herein may comprise applying a compensation delay and/or compensation gain to compensate for the delay and/or gain experienced by said current signal sensed with respect to said one of the first voltage signal or the second voltage signal injected into the signal propagation path towards the electrical load. For instance, the gain can be compensated also on the current.

An adequate delay compensation facilitates a correct evaluation of the phase of the admittance, while having hardly any effect on the evaluation of the modulus of the admittance.

In one or more embodiments where evaluating the modulus (only) is desired, delay compensation may thus be omitted.

A method as exemplified herein may comprise:

applying an actuating signal (an audio signal, such as music, for instance) to said electrical load (for instance, a loudspeaker LS) over said propagation path, injecting said one of the first voltage signal or the second voltage signal into said signal propagation path while said actuating signal is applied to said electrical load.

A method as exemplified herein may comprise repeating said acts of generating, injecting, sensing and processing for a plurality of frequencies of said first voltage signal and said second voltage signal, wherein an admittance of said electrical load may be calculated for the frequencies in said plurality of frequencies, possibly simultaneously for plural frequencies.

In a method as exemplified herein, said electrical load may comprise a loudspeaker.

A circuit as exemplified herein may comprise:

a signal generator (for instance, 10) configured to generate a first voltage signal and a second voltage signal, the second voltage signal in quadrature to the first voltage signal, a signal injection node (for instance, 12) configured to inject one of the first voltage signal or the second voltage signal into a signal propagation path towards an electrical load, a sensing node (for instance, CS) configured to sense a current signal flowing through the electrical load as a result of said one of the first voltage signal or the second voltage signal injected into the signal propagation path towards the electrical load, processing circuitry (for instance, AEP) coupled (for instance, DG) to said signal generator and said sensing node, the processing circuitry configured to perform said acts of calculating a linear combination, executing an approximation procedure and calculating an admittance of said electrical load with the method as exemplified herein.

An audio signal amplifier as exemplified herein (for instance, a class-D amplifier) may be configured to apply an audio signal to a loudspeaker over a signal propagation path, wherein the audio signal amplifier has coupled therewith a circuit as exemplified herein, the circuit having said injection node coupled to said signal propagation path and said sensing node configured to sense a current signal flowing through said loudspeaker as a result of said one of the first voltage signal or the second voltage signal injected into said signal propagation path, wherein the circuit is configured to calculate an admittance of said loudspeaker.

An audio system as exemplified herein may comprise:
an audio signal amplifier as exemplified herein,
at least one loudspeaker coupled to said audio signal amplifier to receive therefrom an audio signal over a signal propagation path,
action circuitry (for instance, A) configured to take action as a function of an admittance calculated for said loudspeaker.

Without prejudice to the underlying principles, the details and embodiments may vary, even significantly, with respect to what has been described by way of example only without departing from the extent of protection.

What is claimed is:

1. A method comprising:
    generating a first voltage signal and a second voltage signal, the second voltage signal in quadrature to the first voltage signal;
    injecting one of the first voltage signal or the second voltage signal into a signal propagation path towards an electrical load;
    sensing a current signal flowing through the electrical load as a result of the one of the first voltage signal or the second voltage signal injected into the signal propagation path; and
    processing the first voltage signal, the second voltage signal and the sensed current signal, wherein processing comprises:
        calculating a linear combination of the first voltage signal and the second voltage signal via a first and a second linear combination coefficient,
        executing an approximation procedure of the sensed current signal via the linear combination, the approximation procedure comprising updating first and second linear combination coefficients until a target approximation is reached, wherein updated values of the first and second linear combination coefficients at the reached target approximation are indicative of an admittance of the electrical load, and
        calculating the admittance of the electrical load as a function the updated values of the first and second linear combination coefficients at the reached target approximation.

2. The method of claim 1, wherein calculating comprises calculating real and imaginary parts of the admittance of the electrical load as a function of the updated values of the first and second linear combination coefficients at the reached target approximation.

3. The method of claim 1, wherein the approximation procedure comprises a least-mean-square procedure targeting a reduction of squared error between the sensed current signal and the linear combination.

4. The method of claim 1, further comprising applying a compensation delay and/or a compensation gain to compensate for a delay and/or a gain experienced by the sensed current signal with respect to the one of the first voltage signal or the second voltage signal injected into the signal propagation path.

5. The method of claim 1, further comprising:
    applying an actuating signal to the electrical load over the propagation path; and
    injecting the one of the first voltage signal or the second voltage signal into the signal propagation path while the actuating signal is applied to the electrical load.

6. The method of claim 1, further comprising repeating the steps of generating, injecting, sensing and processing for a plurality of frequencies of the first voltage signal and the second voltage signal, wherein the admittance of the electrical load is calculated for the frequencies in the plurality of frequencies.

7. The method of claim 1, wherein the electrical load comprises a loudspeaker.

8. A circuit comprising:
    a signal generator configured to generate a first voltage signal and a second voltage signal, the second voltage signal in quadrature to the first voltage signal;
    a signal injection node at which one of the first voltage signal or the second voltage signal is configured to be injected into a signal propagation path towards an electrical load;
    a sensor configured to sense a current signal flowing through the electrical load as a result of the one of the first voltage signal or the second voltage signal injected into the signal propagation path; and
    processing circuitry coupled to the signal generator and the sensor, the processing circuitry configured to:
        calculate a linear combination of the first voltage signal and the second voltage signal via a first and a second linear combination coefficient,
        execute an approximation procedure of the sensed current signal via the linear combination, the approximation procedure comprising updating first and second linear combination coefficients until a target approximation is reached, wherein updated values of the first and second linear combination coefficients at the reached target approximation are indicative of an admittance of the electrical load, and
        calculate the admittance of the electrical load as a function the updated values of the first and second linear combination coefficients at the reached target approximation.

9. The circuit of claim 8, wherein real and imaginary parts of the admittance of the electrical load are calculated as a function of the updated values of the first and second linear combination coefficients at the reached target approximation.

10. The circuit of claim 8, wherein the approximation procedure comprises a least-mean-square procedure targeting a reduction of squared error between the sensed current signal and the linear combination.

11. The circuit of claim 8, wherein the processing circuitry is further configured to apply a compensation delay and/or a compensation gain to compensate for a delay and/or a gain experienced by the sensed current signal with respect to the one of the first voltage signal or the second voltage signal injected into the signal propagation path.

12. The circuit of claim 8, further comprising:
a signal source configured to apply an actuating signal to the electrical load over the propagation path; and
a power amplifier configured to amplify the actuating signal after the first voltage signal or the second voltage signal is injected into the signal propagation path.

13. The circuit of claim 12, wherein the signal source is an acoustic signal source and the electrical load comprises a loudspeaker.

14. An audio system comprising:
an audio signal amplifier; and
at least one loudspeaker coupled to the audio signal amplifier to receive an audio signal from the audio signal amplifier over a signal propagation path,
wherein the audio signal amplifier comprises:
a signal generator configured to generate a first voltage signal and a second voltage signal, the second voltage signal in quadrature to the first voltage signal;
a signal injection node at which one of the first voltage signal or the second voltage signal is configured to be injected into the signal propagation path;
a sensor configured to sense a current signal flowing through the loudspeaker as a result of the one of the first voltage signal or the second voltage signal injected into the signal propagation path; and
processing circuitry coupled to the signal generator and the sensor, the processing circuitry configured to:
calculate a linear combination of the first voltage signal and the second voltage signal via a first and a second linear combination coefficient,
execute an approximation procedure of the sensed current signal via the linear combination, the approximation procedure comprising updating first and second linear combination coefficients until a target approximation is reached, wherein updated values of the first and second linear combination coefficients at the reached target approximation are indicative of an admittance of the loudspeaker, and
calculate the admittance of the loudspeaker as a function the updated values of the first and second linear combination coefficients at the reached target approximation.

15. The audio system of claim 14, wherein real and imaginary parts of the admittance of the loudspeaker are calculated as a function of the updated values of the first and second linear combination coefficients at the reached target approximation.

16. The audio system of claim 14, wherein the approximation procedure comprises a least-mean-square procedure targeting a reduction of squared error between the sensed current signal and the linear combination.

17. The audio system of claim 14, wherein the processing circuitry is further configured to apply a compensation delay and/or a compensation gain to compensate for a delay and/or a gain experienced by the sensed current signal with respect to the one of the first voltage signal or the second voltage signal injected into the signal propagation path.

18. The audio system of claim 14, further comprising action circuitry configured to take action as a function of the admittance calculated for the loudspeaker.

19. The audio system of claim 14, wherein the audio system is a car audio system.

* * * * *